United States Patent [19]
Leuthold

[11] 3,743,856
[45] July 3, 1973

[54] EXCLUSIVE-OR ECL LOGIC CIRCUIT

[75] Inventor: Dale H. Leuthold, San Jose, Calif.

[73] Assignee: Signetics Corporation, Sunnyvale, Calif.

[22] Filed: July 6, 1971

[21] Appl. No.: 159,700

[52] U.S. Cl. .................. 307/216, 307/280, 307/237
[51] Int. Cl. .......................................... H03k 19/32
[58] Field of Search ..................... 307/216, 237, 280

[56] References Cited

UNITED STATES PATENTS

| | | | |
|---|---|---|---|
| 3,519,845 | 7/1970 | Larriva | 307/216 |
| 3,505,535 | 4/1970 | Cavaliere | 307/216 X |
| 2,831,987 | 4/1958 | Jones | 307/216 |

*Primary Examiner*—John S. Heyman
*Attorney*—Flehr, Hohbach, Test, Albritton & Herbert

[57] ABSTRACT

An Exclusive OR circuit for emitter coupled logic (ECL) arrays having two differential current switches with their respective collectors either cross coupled to provide an inverted Exclusive OR output from a negative logic convention.

4 Claims, 3 Drawing Figures

INVENTOR
DALE H. LEUTHOLD
BY Fidler, Hobbach, Test, Albritton & Herbert
ATTORNEYS

EXCLUSIVE-OR ECL LOGIC CIRCUIT

BACKGROUND OF THE INVENTION

The present invention is directed to an Exclusive OR logic circuit of the emitter coupled logic (ECL) type.

In conventional ECL circuits which generate an Exclusive or Boolean function, four input terminals are required; namely both true and complemented terminals for each of the two input variables. In large scale integrated circuit arrays this adds both to the size and complexity of the circuit.

OBJECT AND SUMMARY OF THE INVENTION

It is, therefore, an object of the present invention to provide an improved Exclusive OR circuit.

In accordance with the above object there is provided an Exclusive OR logic circuit having an output signal, F, and input signals A and B. The output signal is related to the input signal by $F = AB + \overline{A}\,\overline{B} \equiv \overline{A \oplus B}$. First and second differential current switches each have a first transistor for respectively receiving the A and B signals. A second transistor of each switch receives a reference signal. The emitters of the first and second transistors are tied together for each switch. First and second current sink means are coupled respectively to the tied emitters of the first and second switches. Means are provided for cross coupling the collectors of the first and second transistors of the first switch respectively to collectors of the second and first transistors of the second switch. Means tie the coupled collectors together to provide the output signal, F.

DETAILED DESCRIPTION OF THE PREFERRED EMBODIMENT

Figures 1, 2, 3:
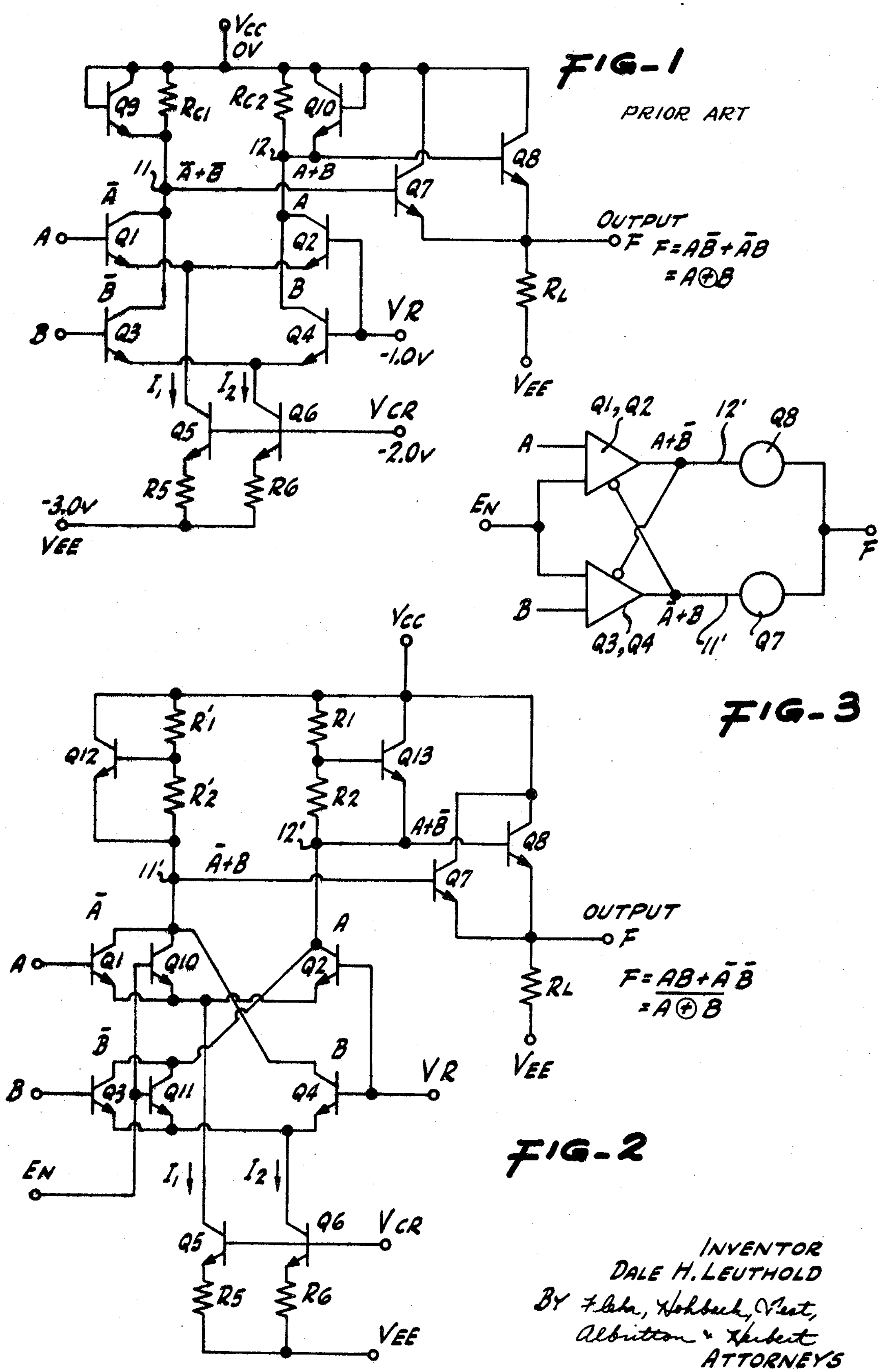
FIG. 1 is a circuit diagram of prior art.
FIG. 2 is a circuit diagram of the invention.
FIG. 3 is a simplified block diagram of FIG. 2.

The Exclusive OR circuit of FIG. 1 provides an output signal, F, and has input signals A and B. The output is low or true only if A and B are different. The typical input voltages are −18V which is the high input or logical false and −1.3V for a low input or logical true.

The circuit includes first and second differential switches each having first transistors Q1 and Q3 for receiving the A and B input signals and second transistors Q2 and Q4 respectively for receiving a reference signal $V_R$ indicated as being a nominal −1.0V. The emitters of Q1 and Q2 are tied together and to a current sink which includes transistor Q5 and resistor R5. Similarly, the emitters of Q3 and Q4 are tied together and to a current sink comprising transistor Q6 and emitter connected resistor R6. Resistors R5 and R6 are coupled to a voltage source $V_{ee}$ which in the present embodiment is −3.0V. The bases of both Q5 and Q6 are coupled to a current source reference voltage $V_{cr}$ which is indicated as being a nominal −2.0V.

The two current sinks Q5 and Q6 receive current $I_1$ and $I_2$ from the current sources consisting of, for the current $I_1$, the emitter of Q1 or Q2 and, for the current $I_2$, the emitter of Q3 and Q4.

The collector of Q1 is connected to the collector of Q3 to provide at the point 11 an OR function of $\overline{A} + \overline{B}$ which is also the base input to a transistor Q7. Similarly, the collectors of Q2 and Q4 are tied together to provide at point 12, which is also the base input to a transistor Q8, an OR function of A + B. Transistors Q7 and Q8 have their emitters and collectors coupled together and form an emitter follower output stage. Their coupled emitter terminals form the output terminal of the circuit and perform an AND function with respect to their respective base inputs. Thus, the emitter follower transistors Q7 and Q8 in essence tie together the coupled collectors of the two current switches A1, Q2 and Q3, Q4 to provide the output signal, F.

In operation with A and B input signals high, 6ma of current flows through clamp Q9 and $R_{c1}$ since both Q1 and Q3 are conducting. Since $R_{c2}$ has no current the base of Q8 is high and the output, F, is high or a logical zero. With A and B both low, the output is the same except that the 6ma of current flows through clamp 10. The purpose of the clamp is to maintain the emitter coupled logic circuit of the present invention in a non-saturated condition. Thus, only a fixed amount of emitter current may flow through the transistors.

With A and B in opposite logic states, $R_{c1}$ and $R_{c2}$ both receive 3*ma* of current. Thus, the base inputs to Q7 and Q8 are low and the output is low or a logical 1. The circuit of FIG. 1 is well known in the art; see e.g., U.S. Pat. No. 3,519,845. However, it cannot provide a true exclusive OR function using a positive logic convention.

The circuit of FIG. 2 is a modification of FIG. 1 where the output F is an inverted Exclusive OR function, using a negative logic convention, which, of course, is also a coincidence function. This is achieved by cross-coupling the collectors of Q1 and Q2 with Q3 and Q4 as illustrated. Thus, the logic function at the point 11' which is the point at which the collector of Q1 is tied to Q4 is $\overline{A}$ + B and the point 12', the tied collectors of Q2 and Q3, represents the logic function A + $\overline{B}$. These are respectively the inputs to emitter follower transistors Q7 and Q8 which when tied together at their emitters form the output terminal and AND the respective input signals on their bases to form the inverted Exclusive OR function, or a true exclusive OR function using a positive logic convention.

Other modifications of the circuit include enable transistors Q10 and Q11 which are parallel connected to Q1 and Q2 and have as their base input an enable terminal $E_N$. A high on the enable input terminal provides an unconditionally low output. These enable transistors Q10 and Q11 can similarly be used in FIG. 1 to provide an unconditionally high output.

FIG. 2 also illustrates a modified collector clamp circuit which includes the transistors Q12 and Q13 where the base input in the case of Q12 is coupled between series connected transistors $R'_1$ and $R'_2$ and the base input terminal Q13 is coupled between resistors $R_1$ and $R_2$. This allows for a higher logic swing for output interfaces.

FIG. 3 illustrates in block diagram form the circuit of FIG. 2 where the first current switch Q1, Q2 has as inputs A and the enable signal and the second current switch Q3, Q4, the B and enable signal. The output of the first current switch is actually the 12' point and of the second current switch Q3, Q4 the 11' point which respectively drive emitter follower transistors Q8 and Q7 to provide an output signal F.

Thus, the present invention provides an emitter coupled logic Exclusive OR circuit which has only to inputs for A and B logic signals to perform an Exclusive OR function. The circuit is particularly useful in integrated format for circuit adders, comparators, and parity generators.

I claim:

1. An Exclusive OR logic circuit of the emitter coupled logic type having an output signal, F, and input signals A and B said output signal being related to said input signals by $F = AB + \overline{A}\,\overline{B} \equiv \overline{A \oplus B}$ said circuit comprising: first and second differential but non-saturating current switches each having a first transistor for respectively receiving said A and B signals and a second transistor for receiving a reference signal the bases of said second transistors being coupled together to receive said reference signal and the emitters of said first and second transistors being tied together for each switch; first and second current sink means coupled respectively to said tied emitters of said first and second switches; means for cross-coupling the collectors of said first and second transistors of said first switch respectively to collectors of said second and first transistors of said second switch; and means for tieing said coupled collectors together to provide said output signal, F.

2. A circuit as in claim 1 where said tieing means include emitter-follower connected transistors.

3. A circuit as in claim 1 together with enable means to provide an unconditional output.

4. A circuit as in claim 3 where said enable means includes first and second transistors respectively parallel connected to said first transistors of said first and second switches.

* * * * *